United States Patent
Kajiwara

[11] Patent Number: 5,957,704
[45] Date of Patent: Sep. 28, 1999

[54] SOCKET FOR ELECTRICAL CONNECTION OF AN ELECTRICAL COMPONENT

[75] Inventor: Yasushi Kajiwara, Kawaguchi, Japan

[73] Assignee: Enplas Corporation, Saitama, Japan

[21] Appl. No.: 08/867,578

[22] Filed: Jun. 2, 1997

[30] Foreign Application Priority Data

May 31, 1996 [JP] Japan .................................. 8-160613

[51] Int. Cl.[6] .................................................. H01R 9/09
[52] U.S. Cl. ............................................................... 439/73
[58] Field of Search ............................ 439/72, 73, 264, 439/266, 330

[56] References Cited

U.S. PATENT DOCUMENTS 5,626,481  5/1997  Abe ........................................... 439/73

FOREIGN PATENT DOCUMENTS 4-155790   5/1992  Japan .
6-86348   12/1994  Japan .

Primary Examiner—Neil Abrams
Assistant Examiner—Javaid Nasri
Attorney, Agent, or Firm—Fish & Richardson P.C.

[57] ABSTRACT

A socket comprises a socket body and a plurality of contactors mounted on the socket body for electrical contact with leads of an electrical component at bottom sides of the leads. Holding members are mounted on the socket body. At least one slider made of an insulating member is held by the holding members and movable between a retracted position where the slider does not confront with the leads of the electrical component and a forward position where the slider can confront with the leads. The slider is urged by springs toward the forward position from the retracted position and is also urged by the holding members in a direction toward the leads. An operating member has a first operating portion which can push the holding members to move the slider upward from the leads of the electrical component and a second operating portion which can move the slider from the forward position to the retracted position against the urging force of the springs after the slider has been moved upward from the leads.

6 Claims, 6 Drawing Sheets

SOCKET FOR ELECTRICAL CONNECTION OF AN ELECTRICAL COMPONENT

BACKGROUND OF THE INVENTION

1. Field of the Invention

The present invention relates to a socket for mounting an electrical component such as an IC package in which a semiconductor integrated circuit (IC) chip is molded and electrically connecting to the electrical component, more particularly relates to a socket which can be suitably used for an operation test of an IC chip in an electrical component.

2. Related Art

In general, the socket used for an operation test of an IC chip in an IC package is provided with a plurality of contactors for electrical contact with the terminals of the IC package. The contactors are arranged and held on the socket body at the same pitch interval as that for terminals of the IC package. In order to hold the IC package and then make the terminals of the IC package and the contactors contact each other with a required contact pressure, the socket body of this type of socket is conventionally provided with pushing members for gripping the IC package or terminals projecting to the sides from the IC package with the contactors and operating members for making the pushing members push against or release the IC package.

For example, the socket disclosed in Japanese Unexamined Patent Publication (Kokai) No. 4-155790 is configured so that the lead terminals of the IC package are gripped by contactors and fixing members having a spring property. When mounting an IC package, the cover, which serves as the operating member, is depressed to push against part of the contactors and move the contact portions of the contactors down once and, at the same time, move the fixing members to the outside direction of the socket body. Next, the IC package is mounted, then the depression of the cover is released to return the fixing members to their original positions and, at the same time, release the pushing force against the contactors to return the contact portions to their original position. By this, the contact portions are pushed against the lead terminals of the IC package, the lead terminals of the IC package are gripped by the contact portions of the contactors and the fixing members, and the IC package and the contactors are made electroconductive.

Further, the socket disclosed in Japanese Unexamined Utility Model Publication (Kokai) No. 6-86348 is configured so that the lead terminals of the IC package are gripped by contactors and pushing portions of pushing members having a spring property. This enables release of the lead terminals of the IC package.

In a socket configured so that parts of the contactors are pushed against to make the contact portions of the contactors move downward once when mounting the IC package, since the contact portions of the contactors are displaced by the operating member, there is a danger of the contact portions and the lead terminals deviating in position from each other when pushing the contact portions of the contactors against the lead terminals. Alternatively, since the displacement is caused by pushing the contactors by the cover, there is a danger of occurrence of undesirable deformation in the contactors, which becomes a factor lowering the positioning precision between the contactors and the lead terminals of the IC package and detracting from the uniformity of the contact pressure.

On the other hand, in a socket configured to push pushing members having a spring property by a cover, that is, an operating member, to make the pushing members release the socket from the top of the package body or lead terminals, it is necessary to displace the pushing members from the forward position to the retracted position against the spring force of the pushing members, so a large operating force is required.

SUMMARY OF THE INVENTION

Accordingly, an object of the present invention is to provide a socket excellent in the reliability of the electrical contact with the terminals of an electrical component and operability.

In order to solve the above object, a socket of the present invention is provided with a socket body; a plurality of contact portions held by the socket body for electrical contact with an electrical component; pushing sliders having pushing portions for pushing the electrical component with the contact portions; holding mechanisms for holding the pushing sliders so that they can move between a retracted position where the pushing portions thereof release the electrical component and a forward position where the electrical component can be pushed against; pushing force imparting mechanisms for imparting a pushing force with respect to the electrical component to the pushing sliders; first operating members for moving the pushing sliders; and second operating members for imparting the pushing force to the pushing sliders and releasing the pushing force.

According to the above configuration, first the pushing sliders are advanced to a position where the pushing portions can push against the electrical component, then the electrical component is pushed against so as to establish stable and reliable electrical contact between the electrical component and the socket. Further, since it is not necessary to move the contact portions to release the gripping force with respect to the electrical component, it is possible to prevent a loss of the reliability of the electrical contact between the contact portions and the electrical component.

Preferably, the holding mechanisms have resiliency and are constituted so as to hold the pushing sliders by elastic force.

According to the above configuration, when moving the pushing sliders, the holding mechanisms are resiliently deformed to weaken the holding force with respect to the pushing sliders and move the pushing sliders, therefore the pushing sliders can be easily moved with a light operating force.

Further, preferably, resiliency is also imparted to the pushing force imparting mechanisms, and the pushing force of the pushing portions of the pushing sliders with respect to the electrical component is obtained from the elastic force possessed by the pushing force imparting mechanisms.

According to the above configuration, the pushing force to the pushing slider can be released by just resiliently deforming the pushing force imparting mechanisms, therefore no complex mechanism is necessary and the configuration of the entire socket can be simplified.

Further, preferably, the holding mechanisms and the pushing force imparting mechanisms are integrally formed.

According to the above configuration, the process of producing the mechanisms for movably holding the pushing sliders and the pushing force imparting mechanisms and assembling them to the socket body can be simplified.

More preferably, the pushing sliders are biased from the retracted position to the forward position by the elastic force.

According to the above configuration, the movement of the pushing sliders from the retracted position to the forward position can be achieved just by releasing the force for fixing the pushing sliders to the retracted position, therefore the mechanisms for movement of the pushing sliders can be simplified.

Further, preferably, the socket is configured so that the pushing sliders are moved from the forward position to the retracted position by a first operating member after the pushing force imparted to the pushing sliders by the pushing force imparting mechanisms is released by a second operating member.

According to the above configuration, when moving the pushing sliders from the forward position to the retracted position, no pushing force is imparted to the pushing sliders, therefore the operating force for moving the pushing sliders can be reduced.

Furthermore, preferably, the contact portions and the pushing force imparting mechanisms are integrally formed.

According to the above configuration, the process of production of the contact portions and the pushing force imparting mechanisms and assembly to the socket body can be simplified. Further, if the holding mechanisms is also integrally formed, the production of the socket is further simplified.

Furthermore, preferably, the contact portions are formed to be movable and can be brought into sliding contact with the terminals of the electrical component.

According to the above configuration, an oxidized film covering the surface of the contact portions and the terminal portions of the electrical components can be removed so the reliability of the electrical contact between the electrical component and the contact portions can be further enhanced.

Furthermore, more preferably, the first operating member and the second operating member are provided on a movement member attached to the socket body so that reciprocal movement substantially parallel to the direction of attachment and detachment of the electrical component becomes possible with respect to the socket body.

According to the above configuration, even if a large number of sockets are arranged on a printed circuit board at close intervals, it is possible to operate an operating member to perform the attachment and detachment of the electrical component without contacting the adjoining sockets when performing the work.

In addition, preferably, the movement of the pushing sliders by the first operating member is a slider movement in a direction different from the pushing direction of the pushing portions of the pushing sliders with respect to the electrical component.

According to the above configuration, it is possible to reduce the size of the entire socket by making the distance of movement of the pushing sliders shorter.

Below, an explanation will be made of embodiments of the present invention referring to the drawings.

DESCRIPTION OF THE PREFERRED EMBODIMENTS

Figure 1:
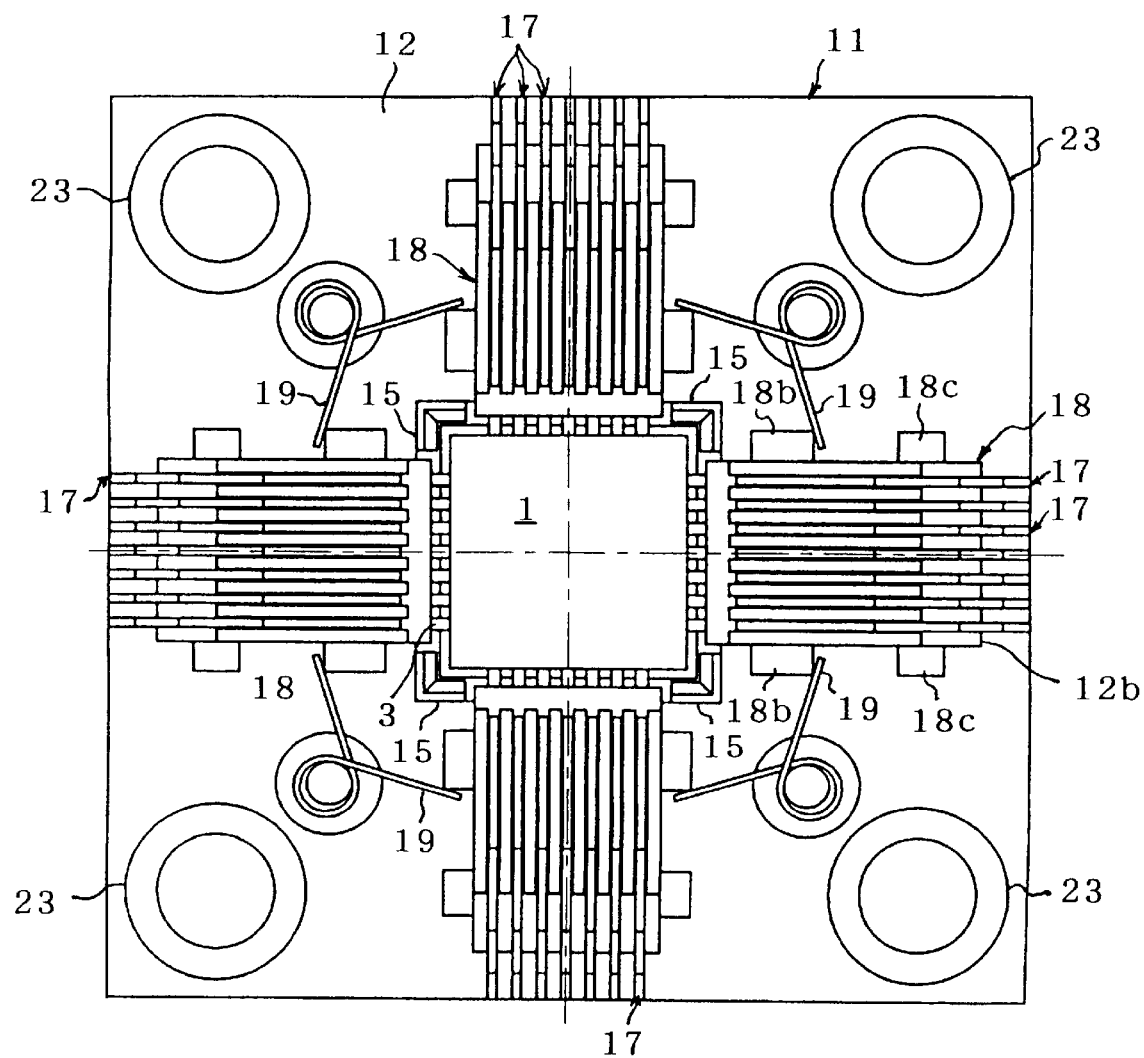
FIG. 1 is a plan view of a state where an operating member is removed showing an embodiment where the present invention is applied to a socket for an IC package having lead terminals.

FIG. 1 to FIG. 6 show an embodiment where the present invention is applied to a socket for a QFP (Quad Flat Package) type IC package. First, referring to FIG. 1 to FIG. 3, a socket 10 has a socket body 11 made of a plastic or other insulating member. This socket body 11 has a base portion 12 and a mounting platform 13 for mounting the IC package 1. The mounting platform 13 is supported on the base portion 12 so that it can resiliently displace in the direction of attachment and detachment of the IC package 1 via a not illustrated spring. Four guides 15 for guiding the body 2 of the IC package 1 at the time of mounting the IC package 1 are provided at the base 12 at positions corresponding to the four corner portions of the body 2.

The IC package 1 has a plurality of lead terminals 3 projecting sideward from the sides of the body 2. A plurality of contactors 16 for electrical contact with the lead terminals 3 of the IC package 1 and a plurality of pushing spring members 17 are held at the base portion 12 of the socket body 11. Each contactor 16 has a base portion 16a, a spring portion 16b extending curved from the base portion 16a, and a contact portion 16c formed at the front end of the spring portion 16b. Due to the spring property of the spring portion 16b of the contactor 16, the contact portion 16c can resiliently contact a lead terminal 3 of the IC package 1. An external connection terminal 16d projected downward is provided at the base portion 16a of the contactor 16. This external connection terminal 16d is press-fit into a through hole 12a formed in the base portion 12 of the socket body 11 and, at the same time, projected downward from the base portion 12.

In the illustrated embodiment, the contactors 16 and the pushing spring members 17 are integrally formed. Each of the pushing spring members 17 has a base portion 17a integrally formed with a base portion 16a of a contactor 16. The pushing spring members 17 slidably hold a pushing slider 18 having a pushing portion 18a for gripping the lead terminals 3 of the IC package 1 with the contactors 16. The pushing slider 18 is made of a plastic or other insulating member. The pushing portion 18a of the pushing slider 18 held by the pushing spring members 17 can slide between a retracted position for releasing the lead terminals 3 of the IC package 1 and a forward position where the lead terminals 3 of the IC package 1 can be pressed against the contactors 16. Further, the pushing spring members 17 are formed so that they can push the pushing portion 18a of the pushing slider 18 against the lead terminals 3 of the IC package 1 with a sufficient pushing force when the pushing portion 18a of the pushing slider 18 is located at the forward position. Namely, the pushing spring members 17 have lower surface supporting portions 17b for supporting the lower surface of the pushing slider 18 and upper surface pushing portions 17c for pushing against the upper surface of the pushing slider 18. The lower surface supporting portions 17b are connected to the base portions 17a, and the upper surface pushing portions 17c are connected to the lower surface supporting portions 17b via curved and extended spring portions 17d. The pushing slider 18 is gripped between the lower surface supporting portions 17b and the upper surface pushing portions 17c, then the pushing portion 18a of the pushing slider 18 is pushed against the lead terminals 3 of the IC package 1 by the upper surface pushing portions 17c.

At the outside of the two ends of the array of the contactors 16, the pushing slider 18 is provided with leg portions 18b projecting downward. Springs 19 for biasing the pushing portion 18a of the pushing slider 18 in a direction toward the forward position from the retracted position are provided at the base portion 12 of the socket body 11.

Figure 2:
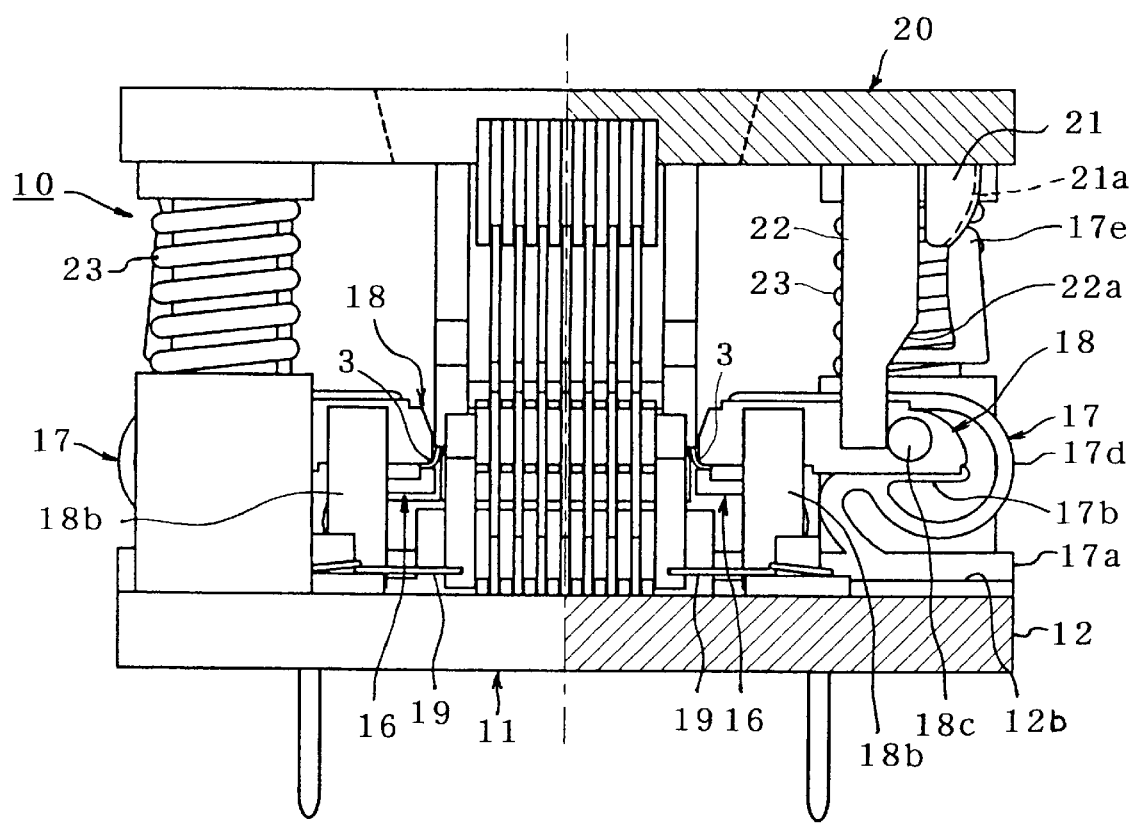
FIG. 2 is a partial semi-sectional side view of the socket shown in FIG. 1.
Figure 3:
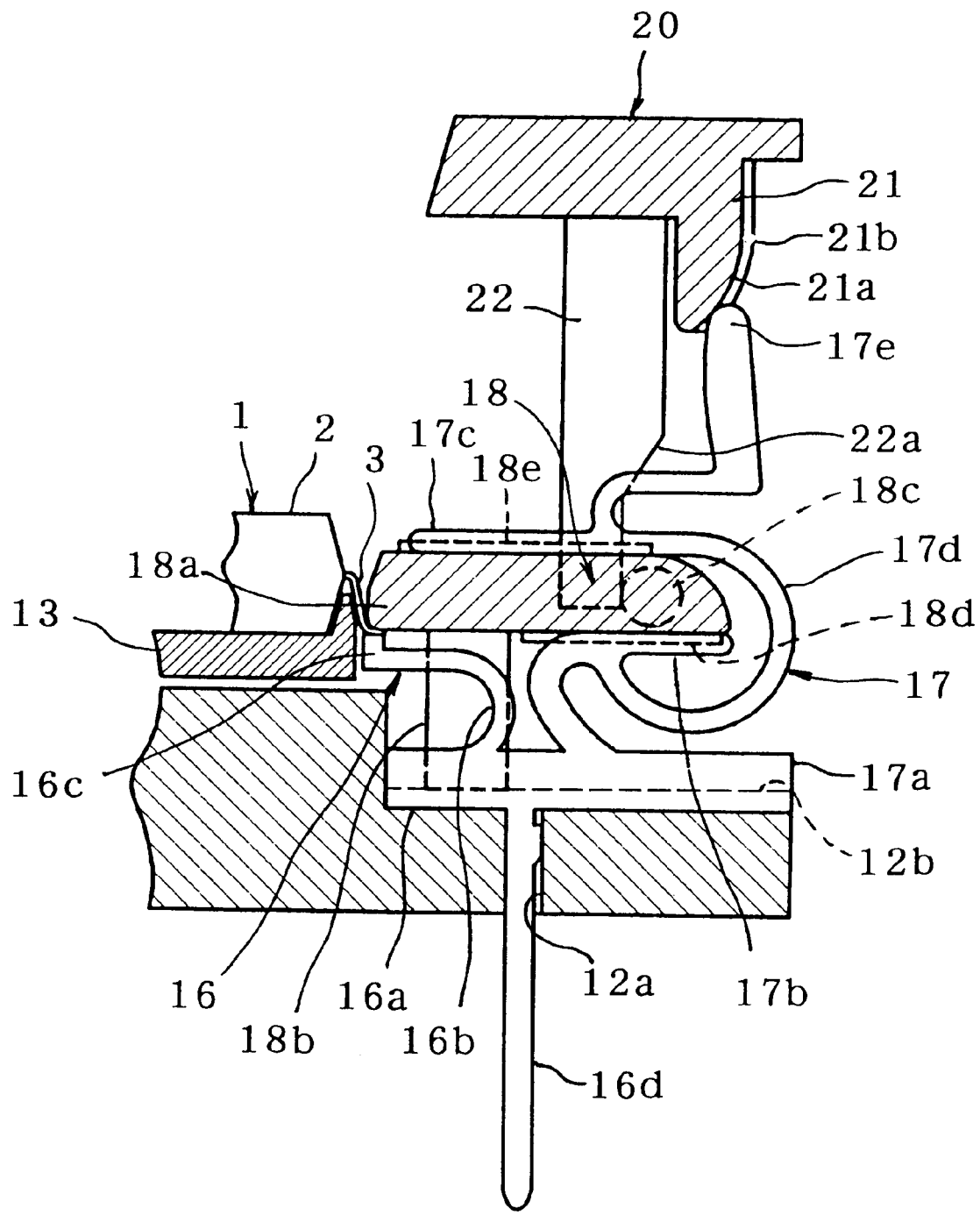
FIG. 3 is a vertically sectional view of principal parts of the socket shown in FIG. 1.

The operating member, shown overall by numeral 20 in FIG. 2 and FIG. 3, can perform reciprocal movement in substantially the same direction (vertical direction in FIG. 2) as the direction of attachment and detachment of the IC package 1 with respect to the base portion 12 of the socket body 11. In the illustrated embodiment, this operating member 20 acts also as a cover with respect to the socket body 11, but the operating member 20 may also be a jig used for at the time of attachment and detachment of the IC package 1 to and from the socket 10. A spring 23 biasing upward the operating member 20 acting also as a cover is provided in the base portion 12 of the socket body 11.

The operating member 20 has a pushing operation portion 21 for performing the pushing or releasing operation of the pushing spring member 17 in accordance with the reciprocal movement thereof and a pair of slider operation portions 22 for making the pushing slider 18 to perform the sliding operation during the release of pushing. At least the pushing operation portion 21 must be formed by a plastic or other insulating member or an insulating coating must be applied to this, but preferably the operating member 20 is entirely formed by a plastic or other insulating material from the viewpoint of the production costs.

In this embodiment, the pushing spring members 17 are provided with cantilevers 17e having roughly L-shapes connected to the upper surface pushing portions 17c thereof. The spring operation portion 21 of the operating member 20 has a cam surface 21a which slidingly contacts these cantilevers 17e. Further, the pushing slider 18 has projections 18c on both ends thereof. The slider operation portion 22 of the operating member 20 has a cam surface 22a which slidingly contacts the projections 18c of the pushing slider 18.

As shown in FIG. 3, the base portion 12 of the socket body 11 is provided with a plurality of ribs 12b for holding the contactors 16 and the base portions 16a and 17a of the pushing spring members 17 from the two side surfaces and defining the pitch thereof. The pushing slider 18 is provided with a plurality of ribs 18d and 18e for holding the lower surface supporting portions 17b and upper surface pushing portions 17c of the pushing springs 17 from the two side surfaces and defining the pitch thereof. Further, the spring operation portion 21 of the operating member 20 is provided with a plurality of ribs 21b for holding the front ends of the cantilevers 17e of the pushing spring members 17 from the two side surfaces and defining the pitch thereof.

Figure 4:
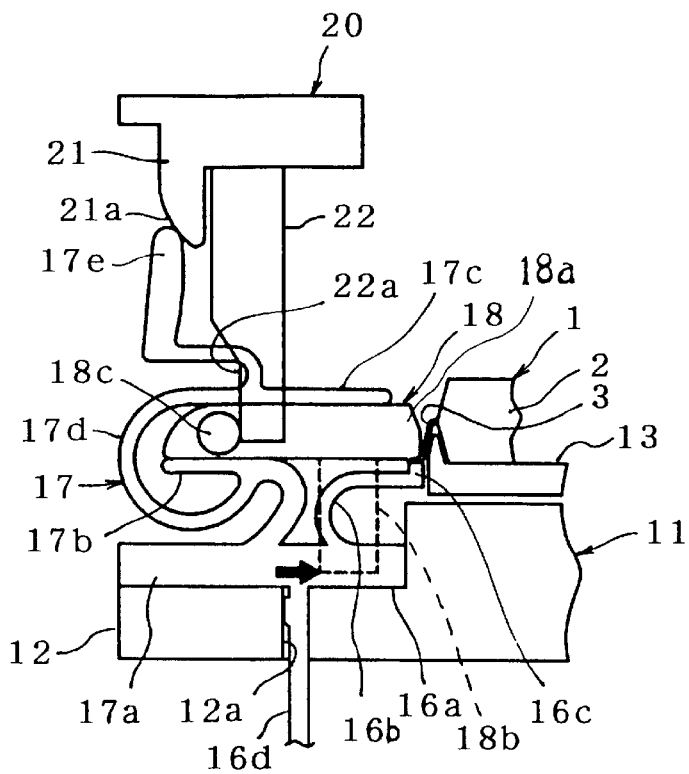
FIG. 4 is an explanatory view of an operation showing a state where the lead terminals of the IC package are gripped by the socket of FIG. 1.
Figure 5:
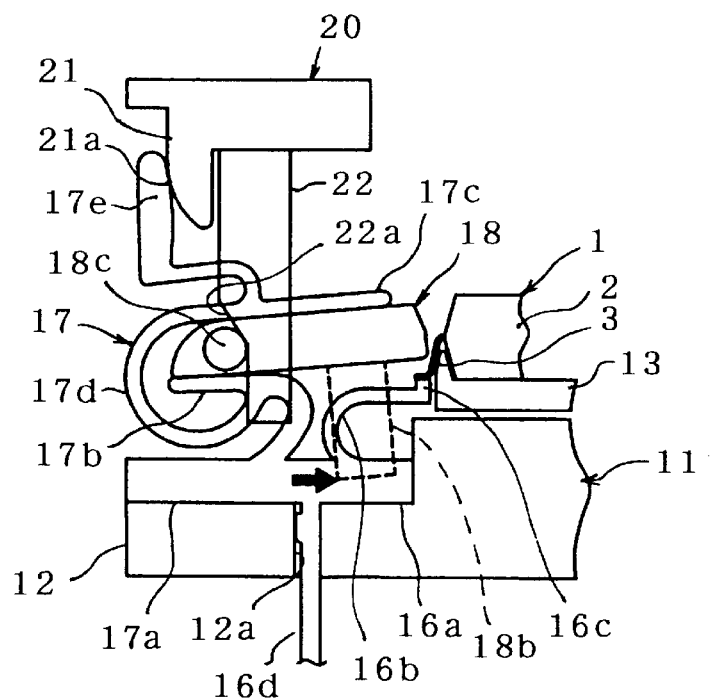
FIG. 5 is an explanatory view of the operation showing a state where the pushing of the pushing sliders with respect to the lead terminals of the IC package is released by the socket of FIG. 1.
Figure 6:
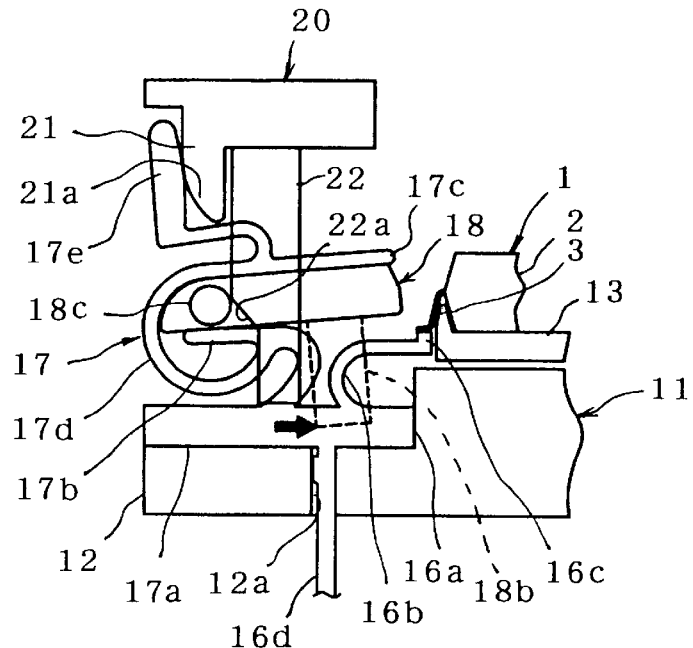
FIG. 6 is an explanatory view of the operation showing a state where the pushing sliders are slid to the retracted position by the socket of FIG. 1.

FIG. 4 to FIG. 6 show the operation of the socket 10 having the above configuration. FIG. 4 shows a state where a lead terminal 3 of the IC package 1 is gripped by a pushing portion 18a of a pushing slider 18 and a contact portion 16c of a contactor 16. At this time, the cam surface 21a of the spring operation portion 21 of the operating member 20 abuts against the cantilever 17e of the pushing spring member 17, but there is no substantial pushing force acting leftward in FIG. 4.

FIG. 5 shows a state where the operating member 20 is depressed from the position of FIG. 4 and the pushing of the pushing spring member 17 is released. During the time when the operating member 20 moves down from the position shown in FIG. 4 to the position shown in FIG. 5, the slider operation portion 22 of the operating member 20 does not give a pushing force leftward in the figure to the pushing slider 18, therefore the pushing slider 18 is held at the forward position. On the other hand, the spring operation portion 21 of the operating member 20 moves the cantilever 17e of the pushing spring member 17 leftward in the figure, therefore the front end side of the upper surface pushing portion 17c of the pushing spring member 17 moves upward, and the pushing portion 18a side of the pushing slider 18 goes away from the lead terminal 3 of the IC package 1 and moves upward along with this. Note that, in FIG. 5, the amount of upward displacement of the pushing slider 18 is exaggerated, but the sliding operation of the pushing slider 18 can be achieved by a light force so far as the pushing force of the pushing slider 18 with respect to the lead terminal 3 is released, therefore the amount of the upward displacement of the pushing slider 18 may be very small.

When the operating member 20 is depressed from the position of FIG. 5 to the position shown in FIG. 6, the cam surface 22a of the slider operation portion 22 of the operating member 20 acts upon the projection 18c of the pushing slider 18 and makes the pushing slider 18 slide from the forward position to the retracted position where the lead terminal 3 of the IC package 1 is released. At this time, the pushing slider 18 is merely held between the lower surface supporting portion 17b and the upper surface pushing portion 17c of the pushing spring member 17 with an appropriate clearance, therefore the pushing slider 18 can be easily slid. Further, the spring 19 biasing the pushing slider 18 from the retracted position to the forward position is for returning the pushing slider 18 to the forward position against its own weight, therefore a strong spring force is not necessary. Accordingly, the spring 19 does not substantially hinder the sliding movement of the pushing slider 18 toward the retracted position.

When the operating member 20 is returned from the position shown in FIG. 6 to the position shown in FIG. 4, first the pushing slider 18 returns from the retracted position to the forward position where the lead terminal 3 can be pushed (refer to FIG. 5), then the cantilever 17e of the pushing spring member 17 is returned to the original position, therefore the upper surface pushing portion 17c pushes the pushing slider 18 and brings it into press-contact with the lead terminal 3. At this time, in the above embodiment, the lead terminal 3 is placed on the contact portion 16c of the contactor 16 having a spring property, therefore during the time when the lead terminal 3 and the contact portion 16c of the contactor 16 slightly sink downward by the pushing force of the pushing slider 18, a wiping effect by the fine sliding movement is obtained between the lead terminal 3 and the contact portion 16c of the contactor 16.

As explained above, the operating member 20 has a spring operation portion 21 for making the pushing spring members 17 perform the pushing or releasing operation in accordance with the reciprocal movement thereof and a slider operation portion 22 for making the pushing slider 18 perform the sliding movement during the release of the pushing, therefore the pushing slider 18 can be easily made to perform the sliding movement by the light force. Further, it is not necessary to press the contactors 16 to move them so as to release the gripping force with respect to the lead terminals 3 of the IC package 1, therefore deterioration of the reliability of the electrical contact between the contactors 16 and the lead terminals 3 of the IC package 1 can be prevented.

Since the contactors 16 and the pushing spring members 17 are integrally formed, the process of producing the contactors 16 and pushing spring members 17 and assembling the same to the socket body 11 can be simplified. Further, positional precision of the pushing spring members 17 with respect to the contactors 16 can be easily secured, so the gripping force with respect to the lead terminals 3 of the IC package 1 can be easily made constant.

Figure 7:
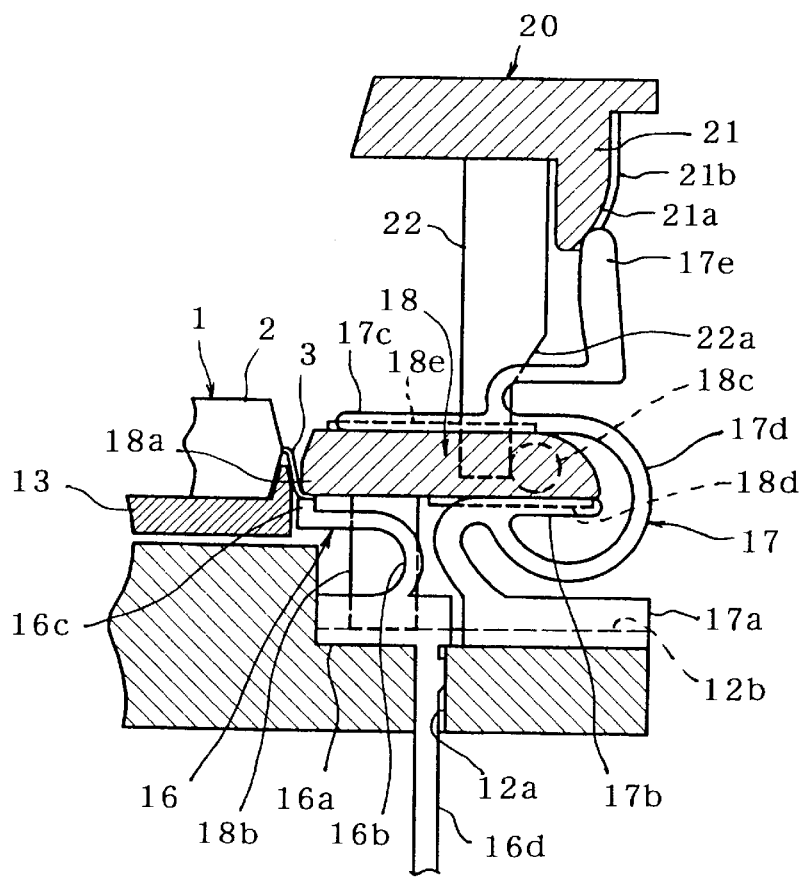
FIG. 7 is a vertical sectional view resembling FIG. 3 showing an example of a modification of the socket according to the present invention.

The above explanation was made with regard to an illustrative embodiment, but the present invention is not limited to just the aspect of the above embodiment. For example, as shown in FIG. 7, it is possible even if the contactors 16 and the pushing spring members 17 are separate and held by the socket body 11. In this case, a smaller number of pushing spring members 17 than that of the contactors 16 can be held at the socket body 11. Further, pushing spring members 17 having a different thickness from that of the contactors 16 can be used, therefore the degree of freedom of the adjustment of the pushing force given to the pushing sliders 18 can be increased without hindering a reduction of the pitch of the contactors 16. Further, by separating the contactors 16 and the pushing spring members 17, the capacitor effect influencing the test of the IC package 1 can be greatly reduced. Further, also the material of the pushing spring members 17 can be selected without relation to the contactors 16.

Figure 8:
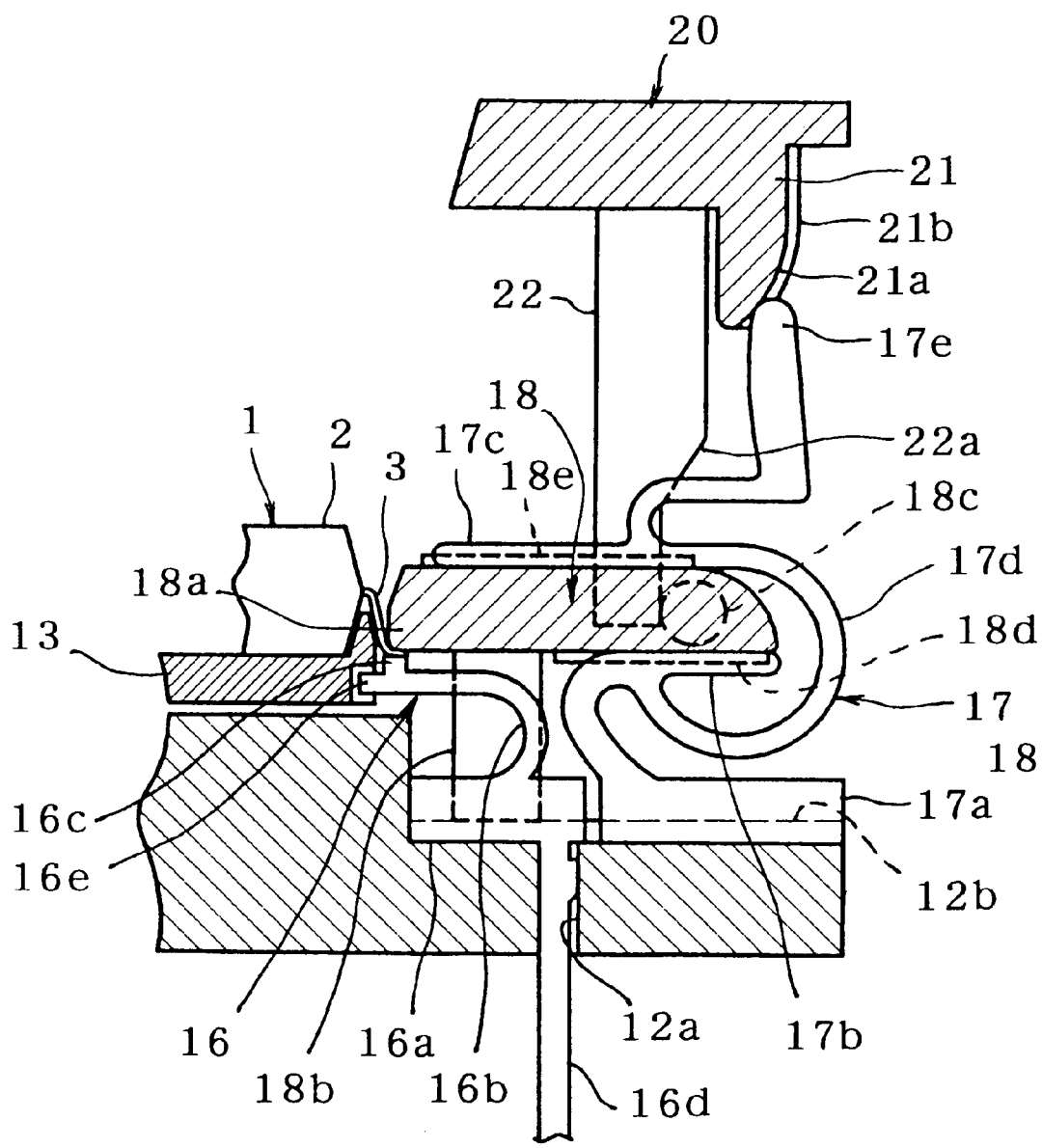
FIG. 8 is a vertical sectional view resembling FIG. 3 showing another example of a modification of the socket according to the present invention.

Further, as shown in FIG. 8, projections 16e which abut against the mounting platform 13 and move the contactors 16 downward together with the mounting platform 13 when a floating type mounting platform 13 sinks a predetermined amount may be provided at the contactors 16. By adopting such a configuration, undesirable deformation of the lead terminals 3 due to an excess sinking of the mounting platform 13 can be prevented.

Further, in the above embodiment, the springs 19 acted so as to push the pushing sliders 18 toward the forward position, but conversely it is also possible to adopt a configuration where the springs 19 act so as to pull the pushing sliders 18 toward the forward position. Further, where the slider operation portion 22 has a cam means capable of making the pushing sliders 18 perform reciprocal movement in the sliding direction, the springs 19 biasing the pushing sliders 18 toward the forward position can be omitted. Further, the socket of the present invention can be applied to electrical components other than the QFP type IC package. For example, in the case of an LGA (Land Grid Array) type IC package, it is possible the configure the socket so that a large number of holes are made in the mounting platform 13 corresponding to the terminal portions existing at the bottom surface of the IC package. The contact portions 16c of the contactors 16 penetrate through these holes so as to contact the terminal portions. At the same time, the pushing sliders 18 are arranged so as to push against the upper surface of the IC package. Note that, in this case, the contactors 16 are not obtained by punching process of an electroconductive thin plate as in the above embodiment, but are desirably made of thin and long wire-like materials or spring probes.

Further, the present invention can be applied to various types of IC packages other than the LGA type such as a leadless type IC package, BGA (Ball Grid Array) type IC package, and SOJ (Small Outline J-lead Package) type IC package by appropriately selecting the contactor 16.

Of course, the present invention can also be applied to a TCP (Tape Carrier Package) if a holding member such as an IC carrier is used.

Further, a flexible circuit board which can be connected to an external circuit may be arranged on an elastic body such as silicone rubber in place of the mounting platform 13 and contactor 16, the terminal portions of electrical component placed on electrode portions on this circuit board, and the electrical component pressed against the elastic body by the pushing sliders 18.

Furthermore, in the above embodiment, the pushing sliders 18 were slid by depressing the operating member 20, but it is possible even a rotation lever or a slide lever moving in a horizontal direction is provided in place of the operating member 20 and the pushing sliders 18 are slid by the operation of this lever.

Further, it is also possible to adopt a configuration wherein grooves for supporting the projections 18c of the pushing sliders 18 and, at the same time, guiding the pushing sliders 18 between the retracted position and the forward position are formed in the base portion 12, the pushing sliders 18 are moved from the retracted position to the forward position along these grooves by an elastic force of the springs 19 or separately provided elastic members, and the lead terminals 3 are pushed by the pushing portions 18a.

As apparent from the above explanation, according to the present invention, it is not necessary to move the contact portions for releasing the gripping force by the pushing sliders and the contact portions when mounting an electrical component on the socket, therefore positional deviation between the contact portions and electrical component can be prevented. Accordingly, a socket excellent in the reliability of the electrical contact with the terminals of the electrical component and operability can be provided.

What is claimed is:

1. A socket for electrical connection of an electrical component, said socket comprising:
    a socket body;
    a plurality of contactors mounted on said socket body in locations to make electrical contact with leads of an electrical component at bottom sides of said leads;
    at least one slider which is made of an insulating member;
    holding members mounted on said socket body for holding said slider at upper sides of said leads so that said slider can move between a retracted position where said slider does not confront said leads, and a forward position where said slider can confront said leads to urge said slider in a direction toward said leads of said electrical component;
    means for urging said slider in a direction toward said forward position from said retracted position;
    means for pushing said holding members to move said slider upward from said leads of said electrical component; and
    means for moving said slider from said forward position to said retracted position against said urging means after said slider has been moved upward from said leads.

2. A socket according to claim 1, wherein said holding members have resiliency and hold said slider movably by elastic force.

3. A socket according to claim 1 or 2, wherein said contactors are movably formed and can be brought into sliding contact with said leads of said electrical component.

4. A socket according to claim 1 or 2, wherein said holding members are integrally formed with said contactors, respectively.

5. A socket according to claim 1, wherein said means for pushing said holding members and said means for moving said slider are provided on a movement member which is attached to said socket body and also is movable in substantially parallel to a direction of attachment and detachment of the electrical component with respect to said socket body.

6. A socket according to claim 4, wherein said contactors are movably formed and can be brought into sliding contact with said leads of said electrical component.

* * * * *